(12) United States Patent
Fujita et al.

(10) Patent No.: US 9,276,144 B2
(45) Date of Patent: Mar. 1, 2016

(54) QUANTUM CASCADE DETECTOR

(71) Applicant: HAMAMATSU PHOTONICS K.K., Hamamatsu-shi, Shizuoka (JP)

(72) Inventors: Kazuue Fujita, Hamamatsu (JP); Toru Hirohata, Hamamatsu (JP); Tadataka Edamura, Hamamtsu (JP); Tatsuo Dougakiuchi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/525,415

(22) Filed: Oct. 28, 2014

(65) Prior Publication Data
US 2015/0123076 A1 May 7, 2015

(30) Foreign Application Priority Data
Nov. 1, 2013 (JP) ................. 2013-228151

(51) Int. Cl.
*H01L 31/00* (2006.01)
*H01L 31/0352* (2006.01)
*H01L 31/09* (2006.01)
*H01L 31/105* (2006.01)
H01L 31/0687 (2012.01)

(52) U.S. Cl.
CPC ........ *H01L 31/035236* (2013.01); *H01L 31/09* (2013.01); *H01L 31/105* (2013.01); *H01L 31/06875* (2013.01)

(58) Field of Classification Search
CPC ................. H01L 31/035236; H01L 31/06875; H01L 33/14; H01L 31/105; H01L 31/09
USPC ................... 257/14, 184, 636, 668, E29.069, 257/E29.089, 15, 17, 21, E33.008, E33.01; 438/57
See application file for complete search history.

(56) References Cited

FOREIGN PATENT DOCUMENTS

JP 2013-041933 A 2/2013

OTHER PUBLICATIONS

Fabrizio R. Giorgetta et al., "Quantum Cascade Detectors," IEEE Journal of Quantum Electronics, Aug. 2009, pp. 1039-1052, vol. 45, No. 8.
L. Gendron et al., "High resistance narrow band quantum cascade photodetectors," Applied Physics Letters, 2005, pp. 121116-1-121116-3, vol. 86.

*Primary Examiner* — Kimberly Rizkallah
*Assistant Examiner* — Maria Ligai
(74) *Attorney, Agent, or Firm* — Drinker Biddle & Reath LLP

(57) ABSTRACT

A quantum cascade detector includes a semiconductor substrate, and an active layer formed by laminating unit laminate structures each having an absorption region with a first barrier layer to a second well layer and a transport region with a third barrier layer to an n-th well layer. A second absorption well layer has a layer thickness ½ or less of that of a first absorption well layer thickest in one period, and a coupling barrier layer has a layer thickness smaller than that of an exit barrier layer thickest in one period. The unit laminate structure has a detection lower level arising from a ground level in the first well layer, a detection upper level generated by coupling an excitation level in the first well layer and a ground level in the second well layer, and a transport level structure for electrons.

6 Claims, 6 Drawing Sheets

*Fig.4*

| SEMICONDUCTOR LAYER | | COMPOSITION | LAYER THICKNESS | DOPING |
|---|---|---|---|---|
| ABSORPTION REGION 17 | BARRIER LAYER 171 | InAlAs | 2.0nm | undoped |
| | WELL LAYER 161 | InGaAs | 5.4nm | Si doped: $4\times10^{17}/cm^3$ |
| | 172 | InAlAs | 2.0nm | undoped |
| | 162 | InGaAs | 1.5nm | undoped |
| TRANSPORT REGION 18 | BARRIER LAYER 173 | InAlAs | 3.7nm | undoped |
| | WELL LAYER 163 | InGaAs | 2.0nm | undoped |
| | 174 | InAlAs | 2.8nm | undoped |
| | 164 | InGaAs | 2.0nm | undoped |
| | 175 | InAlAs | 3.3nm | undoped |
| | 165 | InGaAs | 2.4nm | undoped |
| | 176 | InAlAs | 2.0nm | undoped |
| | 166 | InGaAs | 3.1nm | undoped |
| | 177 | InAlAs | 1.8nm | undoped |
| | 167 | InGaAs | 3.5nm | undoped |

LAYER THICKNESS OF COUPLING BARRIER LAYER (nm)

QUANTUM CASCADE DETECTOR

BACKGROUND OF THE INVENTION

1. Field of the Invention

The present invention relates to a quantum cascade detector utilizing intersubband light absorption in a quantum well structure.

2. Related Background Art

As a photodetector in the mid-infrared wavelength region, normally, a HgCdTe (MCT) detector is used. However, this MCT detector has a problem such as containing toxic environmental pollution materials, so that the MCT detector cannot be generally and widely used. Therefore, a novel photodetector in such a wavelength region has been demanded.

In recent years, as such a photodetector, quantum cascade detectors (QCD) using GaAs/AlGaAs quantum cascade structures, etc., have been reported. A quantum cascade detector is a photodetector which absorbs light in its cascade structure, and by measuring the amount of current flowed by carriers generated by the light absorption, detects incident light, and is operable with no bias. Further, in the quantum cascade detector, as in the case of a quantum cascade laser, by multistage cascade-coupling semiconductor lamination structures each including an absorption well layer that absorbs light, light can be more efficiently absorbed and detected (refer to Patent Document 1 and Non-Patent Documents 1 and 2).

Patent Document 1: Japanese Patent Application Laid-Open No. 2013-41933

Non-Patent Document 1: F. R. Giorgetta et al., "Quantum Cascade Detectors," IEEE Journal of Quantum Electronics Vol. 45 (2009) pp. 1039-1052

Non-Patent Document 2: L. Gendron et al., "High resistance narrow band quantum cascade photodetectors," Appl. Phys. Lett. Vol. 86 (2005) pp. 121116-1-121116-3

SUMMARY OF THE INVENTION

Regarding a quantum cascade detector, photodetecting operations at various wavelength bands have been reported by using, in addition to the above-described GaAs/AlGaAs quantum cascade structure, the other semiconductor material systems of, for example, InGaAs/InAlAs and InGaAs/AA/AlAsSb. However, photodetection sensitivity in this case remains at a low level compared with sensitivities of the conventional photodetectors.

A possible cause of this low sensitivity is that, in an existing quantum cascade detector, carrier transport is still in an inefficient state due to, for example, a reverse current generated at a high speed by longitudinal optical (LO) phonon scattering, etc. That is, it is supposed that, in a quantum cascade detector having the conventional structure, electrons excited to an excitation level (detection upper level) by light absorption from a ground level (detection lower level) in the absorption well layer are not taken out as a current but are relaxed in the reverse direction to the detection lower level by LO phonon scattering, and therefore, sufficient photodetection sensitivity cannot be obtained.

The present invention has been made to solve the above-described problem, and an object thereof is to provide a quantum cascade detector with improved photodetection sensitivity to incident light.

In order to achieve the above object, a quantum cascade detector according to the present invention includes (1) a semiconductor substrate, and (2) an active layer being provided on the semiconductor substrate, and having a cascade structure formed by multistage-laminating unit laminate structures each consisting of n (where n is an integer of 4 or more) quantum barrier layers and n quantum well layers, and (3) in the unit laminate structure, the n quantum barrier layers and the n quantum well layers are formed in the order of a first barrier layer, a first well layer, a second barrier layer, a second well layer, . . . , an n-th barrier layer, and an n-th well layer from the side of the unit laminate structure of the preceding stage, the first barrier layer to the second well layer constitute an absorption region, and the third barrier layer to the n-th well layer constitute a transport region, (4) in the absorption region, the first well layer functions as a first absorption well layer, the second well layer functions as a second absorption well layer, and the second barrier layer between these layers functions as a coupling barrier layer, and in the transport region, the third barrier layer functions as an exit barrier layer, (5) the first absorption well layer has the largest layer thickness among the n quantum well layers, the second absorption well layer has a layer thickness ½ or less of that of the first absorption well layer, the exit barrier layer has the largest layer thickness among the n quantum barrier layers, and the coupling barrier layer has a layer thickness smaller than that of the exit barrier layer, (6) the unit laminate structure has, in its subband level structure, a detection lower level arising from a ground level in the first absorption well layer, a detection upper level generated by coupling an excitation level in the first absorption well layer and a ground level in the second absorption well layer, and a third level to an n-th level arising from the third well layer to the n-th well layer, and an energy interval between the detection lower level and the detection upper level is set to be larger than the energy $E_{LO}$ of longitudinal optical phonon, and (7) light is detected by intersubband absorption from the detection lower level to the detection upper level in the absorption region, and electrons excited by the intersubband absorption move to the third level due to the resonant tunneling effect, and are transported to the detection lower level in the unit laminate structure of the subsequent stage via a transport level structure consisting of the third level to the n-th level in the transport region.

In the above-described quantum cascade detector, the active layer uses a cascade structure configured by unit laminate structures each of which is formed by alternately laminating the first barrier layer to the n-th barrier layer and the first well layer to the n-th well layer, and includes an absorption region to be used for light absorption and detection and a transport region to be used for transport of electrons. Among the semiconductor layers constituting the unit laminate structure, the first barrier layer to the second well layer constitute the absorption region, and the third barrier layer to the n-th well layer constitute the transport region, and in the absorption region, the first well layer, the second barrier layer, and the second well layer are a first absorption well layer, a coupling barrier layer, and a second absorption well layer, respectively, and in the transport region, the third barrier layer is an exit barrier layer.

Further, in this configuration, the first absorption well layer is formed as a thickest well layer in one period, the layer thickness of the second absorption well layer is set to ½ or less of that of the first absorption well layer, and the exit barrier layer is formed as a thickest barrier layer in one period, and the layer thickness of the coupling barrier layer is set to be smaller than that of the exit barrier layer. With this coupled quantum well structure, in the absorption region, for the detection lower level caused by the ground level in the first absorption well layer, a level generated by coupling the first excitation level in the first absorption well layer and the ground level in the second absorption well layer can be used as a detection upper level.

With this configuration, electron transition according to light absorption from the detection lower level to the detection upper level becomes a transition (diagonal transition) between levels whose centers of wave functions are spatially separated from each other since the detection upper level is a coupled level between two well layers. Accordingly, the carrier lifetime at the detection upper level is lengthened, and relaxation of electrons excited to the detection upper level by light absorption to the detection lower level and generation of a reverse current caused by the relaxation can be suppressed.

Further, in the above-described quantum cascade detector, the energy interval between the detection lower level and the detection upper level to be used for light absorption is set to be larger than the energy $E_{LO}$ of longitudinal optical (LO) phonons. With this configuration, in the transport level structure for electrons consisting of the third level to the n-th level caused by the third well layer to the n-th well layer in the transport region, high-speed relaxation of electrons by LO phonon scattering can be used. In this case, electrons excited to the detection upper level by light absorption move to the third level in the transport region due to the resonant tunneling effect, and are further transported at a high speed to the detection lower level in the unit laminate structure of the subsequent stage through an electron transport process including high-speed relaxation using LO phonon scattering in the transport level structure consisting of the third level to the n-th level. Accordingly, in the quantum cascade detector constituted as described above, photodetection sensitivity to incident light can be improved.

Here, in the above-described quantum cascade detector, the energy interval between the detection lower level and the detection upper level to be used for light absorption is set to be larger than the energy of LO phonon as described above, so that the detector becomes a photodetector which operates in a mid-infrared region. Further, the above-described subband level structure in the unit laminate structure can be designed and controlled according to the design of the quantum well structure in the unit laminate structure.

With the quantum cascade detector according to the present invention, in the unit laminate structure constituting the active layer, the first barrier layer to the second well layer constitute an absorption region, the third barrier layer to the n-th well layer constitute a transport region, and in the absorption region, the first well layer, the second barrier layer, and the second well layer are a first absorption well layer, a coupling barrier layer, and a second absorption well layer, respectively, and in the transport region, the third barrier layer is an exit barrier layer, the first absorption well layer is formed as a thickest well layer in one period, the layer thickness of the second absorption well layer is set to ½ or less of the layer thickness of the first absorption well layer, and the exit barrier layer is formed as a thickest barrier layer in one period, the layer thickness of the coupling barrier layer is set to be smaller than the layer thickness of the exit barrier layer, and further, in the absorption region, for the detection lower level arising from the ground level in the first absorption well layer, a level generated by coupling the excitation level in the first absorption well layer and the ground level in the second absorption well layer is used as a detection upper level, and the energy interval between the detection lower level and the detection upper level is set to be larger than the energy of LO phonon, and accordingly, the photodetection sensitivity for incident light can be improved.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 4 is a chart showing an example of a structure of a unit laminate structure of one period in the active layer.

DESCRIPTION OF THE EMBODIMENTS

Figure 1:
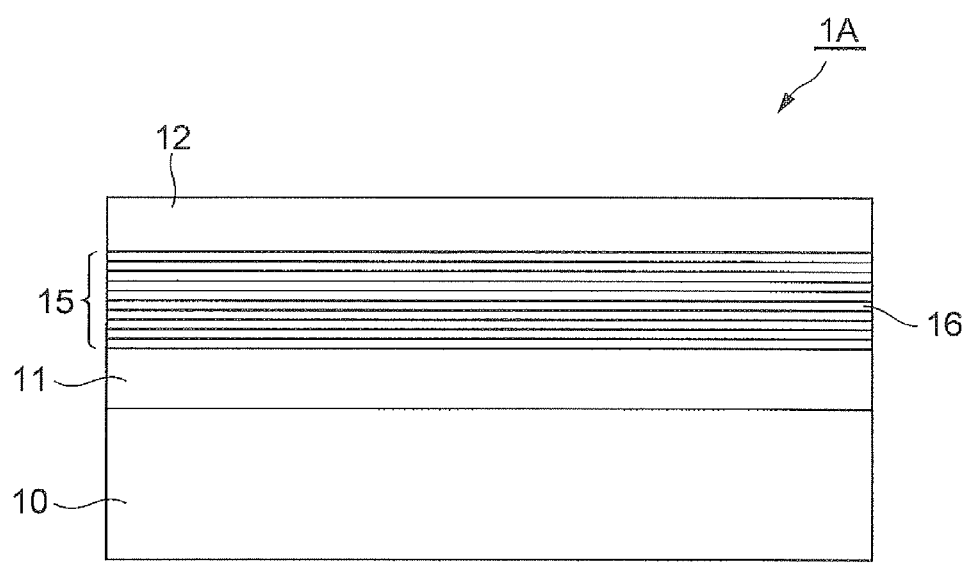
FIG. 1 is a diagram showing an example of a basic configuration of a quantum cascade detector.

Hereinafter, an embodiment of a quantum cascade detector according to the present invention will be described in detail with reference to the drawings. In the description of the drawings, the same components are attached with the same reference symbols, and overlapping description will be omitted. Moreover, the dimensional ratios in the drawings are not always equal to those in the description.

FIG. 1 is a diagram schematically showing an example of a basic configuration of a quantum cascade detector according to the present invention. A quantum cascade detector 1A according to the present embodiment is a photodetector that detects light by utilizing light absorption using intersubband electron excitation in a semiconductor quantum well structure. This quantum cascade detector 1A includes a semiconductor substrate 10, and an active layer 15 formed on the semiconductor substrate 10.

The active layer 15 has a cascade structure formed by alternately multistage-laminating absorption regions (light absorption layers) to be used for light absorption and detection, and transport regions (electron transport layers) to be used for transporting electrons being carriers. Specifically, a semiconductor lamination structure consisting of an absorption region and a transport region is defined as a unit laminate structure 16 of one period, and by multistage-laminating the unit laminate structures 16, the active layer 15 having the cascade structure is formed.

The number of unit laminate structures 16 to be laminated in the active layer 15 is properly set according to photodetection characteristics required for the detector 1A, etc. The active layer 15 is formed on the semiconductor substrate 10 directly or via another semiconductor layer. In the configuration example shown in FIG. 1, on the semiconductor substrate 10, in order from the substrate side, a lower contact layer 11, the active layer 15 formed by multistage-laminating the unit laminate structures 16, and an upper contact layer 12 are laminated in this order, and accordingly, a device structure of the quantum cascade detector 1A is formed.

Figure 2:
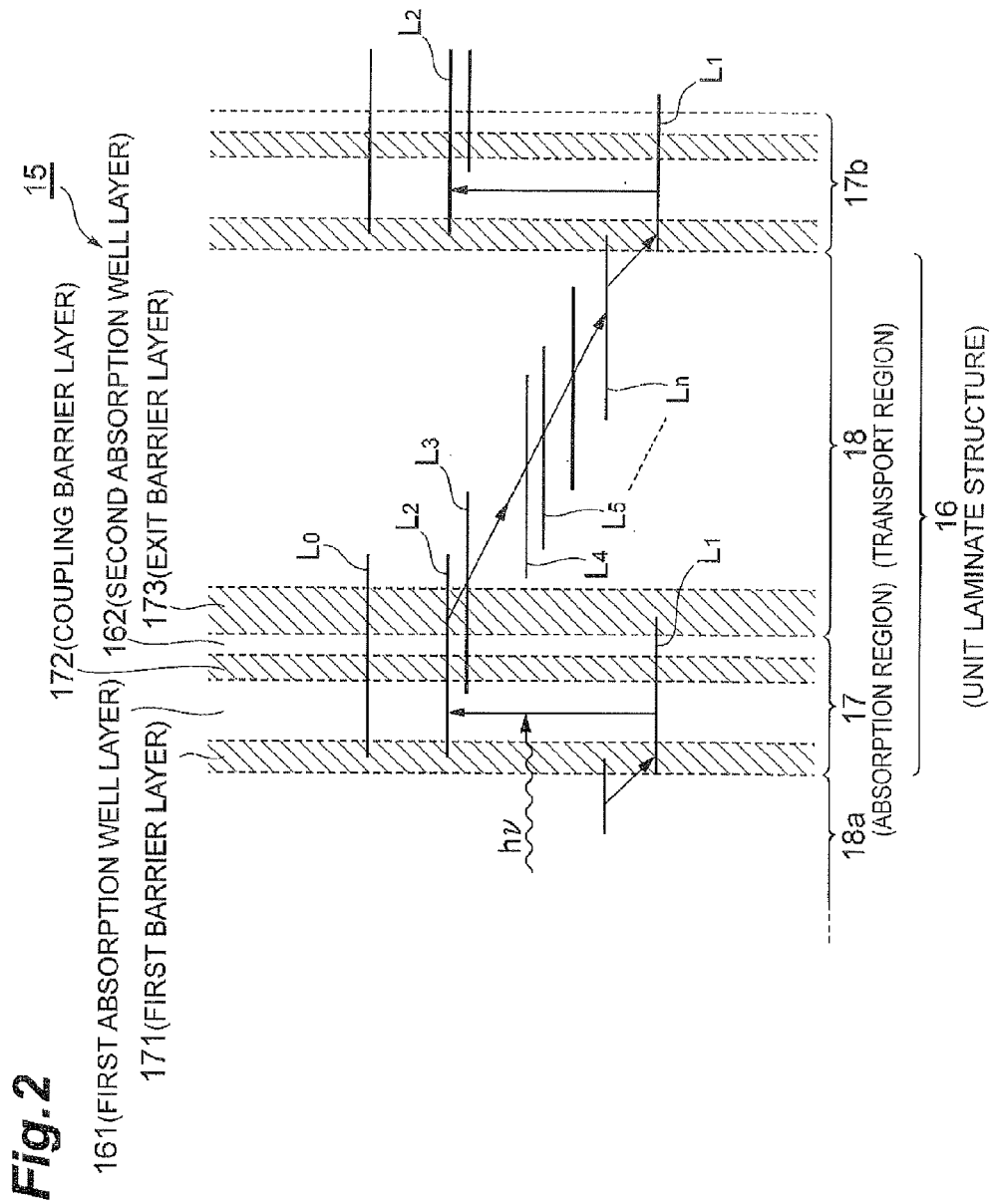
FIG. 2 is a diagram showing a subband level structure in an active layer of the quantum cascade detector.

FIG. 2 is a diagram showing a subband level structure in the active layer of the quantum cascade detector 1A shown in FIG. 1. As shown in FIG. 2, each of the plurality of unit laminate structures 16 included in the active layer 15 consists of n quantum barrier layers and n quantum well layers provided that n is an integer of 4 or more. These n barrier layers and well layers are formed in the order of, from the transport region 18a side of the unit laminate structure of the preceding stage, the first barrier layer, the first well layer, the second barrier layer, the second well layer, ..., the n-th barrier layer, and the n-th well layer. Among these respective semiconductor layers, the first barrier layer to the second well layer constitute an absorption region 17, and the third barrier layer to the n-th well layer constitute a transport region 18. With this configuration, in the unit laminate structure 16, the subband level structure being an energy level structure using the quantum well structure is formed.

Here, in the absorption region 17 consisting of first and second barrier layers 171 and 172 and first and second well layers 161 and 162, the first well layer 161 functions as a first absorption well layer, the second well layer 162 functions as a second absorption well layer, and the second barrier layer 172 provided between these layers functions as a coupling barrier layer. Accordingly, the absorption region 17 in the present embodiment is constituted to have a coupled quantum well structure configured by the first absorption well layer 161, the coupling barrier layer 172, and the second absorption well layer 162. In the transport region 18, a third barrier layer 173 positioned closest to the absorption region 17 side functions as an exit barrier layer for electrons that move from the absorption region 17 to the transport region 18.

In the unit laminate structure 16 shown in FIG. 2, regarding the thicknesses of the respective well layers, specifically, the first absorption well layer 161 has the largest layer thickness among the n quantum well layers of one period, and the second absorption well layer 162 has a layer thickness that is ½ or less of that of the first absorption well layer 161. Regarding the thicknesses of the respective barrier layers, the exit barrier layer 173 has the largest layer thickness among the n quantum barrier layers of one period, and the coupling barrier layer 172 has a layer thickness sufficiently smaller than that of the exit barrier layer 173. According to these layer thickness conditions, the above-described coupled quantum well structure is preferably constituted.

The unit laminate structure 16 in the present embodiment has, in its subband level structure, a detection lower level $L_1$ arising from a ground level in the first absorption well layer 161, a detection upper level $L_2$ generated by coupling an excitation level in the first absorption well layer 161 and a ground level in the second absorption well layer 162, and a third level $L_3$, a fourth level $L_4$, ..., and an n-th level $L_n$ arising from the respective well layers in the transport region 18. The third level $L_3$ to the n-th level $L_n$ are, for example, levels arising from the third well layer to the n-th well layer, and generated as a result of quantum mechanical coupling.

Among these energy levels, the detection lower level $L_1$ and the detection upper level $L_2$ are levels relating to light absorption using intersubband electron excitation. The third level $L_3$ to the n-th level $L_n$ constitute a transport level structure (relaxation level structure) relating to relaxation, transport, and extraction of electrons excited by light absorption. The energy interval $\Delta E_{21}$ between the detection lower level $L_1$ and the detection upper level $L_2$ that determines energy of light absorption in the absorption region is set to be larger than the energy $E_{LO}$ of LO phonon ($\Delta E_{21} > E_{LO}$).

In the above-described subband level structure, the third level $L_3$ to the n-th level $L_n$ are, for example, levels arising from the ground levels in the third well layer to the n-th well layer, respectively. Here, the third level $L_3$ to the n-th level $L_n$ constituting a transport level structure for electrons are normally set so that the energy becomes sequentially lower from the third level $L_3$ on the absorption region 17 side toward the n-th level $L_n$ on the absorption region 17b side of the unit laminate structure of the subsequent stage. However, the energy order of these levels can be partially changed as long as transport of electrons is possible.

Further, levels generated by coupling the first excitation level in the first absorption well layer 161 and the ground level in the second absorption well layer 162 are normally two levels of a coupled level on the lower energy side (one level) and a coupled level on the higher energy side (the other level). Of these levels, the coupled level on the lower energy side is used as the above-described detection upper level $L_2$. The coupled level $L_0$ on the higher energy side is preferably set so that the energy interval $\Delta E_{02}$ between the level $L_0$ and the detection upper level $L_2$ becomes larger than the energy $E_{LO}$ of LO phonon ($\Delta E_{02} > E_{LO}$).

Regarding respective subband levels constituting a transport level structure for electrons, the energy interval $\Delta E_{23}$ between the detection upper level $L_2$ and the third level $L_3$ for extraction of electrons is set so that coupling between the levels becomes sufficiently strong by considering movement and extraction of electrons due to the resonant tunneling effect. The strength of coupling between levels can be evaluated based on an anticrossing energy gap between the levels.

The energy interval $\Delta E_{34}$ between the third level $L_3$ and the fourth level $L_4$ is set to be $E_{LO}$ or more and $2 \times E_{LO}$ or less, so as to satisfy the following conditions:

$$E_{LO} \leq \Delta E_{34} \leq 2 \times E_{LO}$$

with respect to the energy $E_{LO}$ of LO phonon.

Here, the energy $E_{LO}$ of LO phonon is, for example, $E_{LO}=34$ meV on the assumption that InGaAs is used as a semiconductor material of the quantum well layers. Further, the energy $E_{LO}$ of LO phonon is 36 meV when the quantum well layers are made of GaAs, and 32 meV when the quantum well layers are made of InAs, and these values are substantially comparable with 34 meV described above. The above-described setting conditions of the energy interval $\Delta E_{34}$ between the levels with respect to $E_{LO}$ is in consideration of increases in speed and efficiency of electron transport in the transport level structure.

In this subband level structure, by using a semiconductor layer doped with an n-type impurity as the first absorption well layer 161, electrons are accumulated at the detection lower level $L_1$ of the first absorption well layer 161, before light is made incident. When light hv to be detected is made incident on the active layer 15, electrons present at the detection lower level $L_1$ are excited to the detection upper level $L_2$ being a coupled level by intersubband electron transition by light absorption.

Electrons excited to the detection upper level $L_2$ are extracted at a high speed to the third level $L_3$ by the resonant tunneling effect, and further, via the transport level structure consisting of the third level $L_3$ to the n-th level $L_n$, through the relaxation process such as LO phonon scattering from the third level $L_3$ to the fourth level $L_4$, transported and extracted at a high speed to the detection lower level $L_1$ of the absorption region 17b of the subsequent stage.

By repeating these electron excitation by light absorption, relaxation and transport of excited electrons, and extraction of electrons to the unit laminate structure of the next period in the plurality of unit laminate structures 16 constituting the active layer 15, light absorption occurs in a cascade manner in the active layer 15. Then, a forward direction current generated by the light absorption is extracted and the amount of current is measured, and accordingly, the incident light hv is detected.

The effects of the quantum cascade detector 1A according to the present embodiment will be described.

In the quantum cascade detector 1A shown in FIG. 1 and FIG. 2, in the active layer 15, a cascade structure configured by the unit laminate structures 16 each of which is formed by alternately laminating the first barrier layer to the n-th barrier layer and the first well layer to the n-th well layer, and includes the absorption region 17 to be used for light absorption and detection and the transport region 18 to be used for transport of electrons is used. Among the semiconductor layers constituting the unit laminate structure 16, the first barrier layer to the second well layer constitute the absorption region 17, the third barrier layer to the n-th well layer constitute the transport region 18, and in the absorption region 17, the first well layer 161, the second barrier layer 172, and the second well layer 162 are a first absorption well layer, a coupling barrier layer, and a second absorption well layer, respectively, and in the transport region 18, the third barrier layer 173 is an exit barrier layer.

Further, in this configuration, the first absorption well layer 161 is formed as a thickest well layer in one period, the layer thickness of the second absorption well layer 162 is set to ½ or less of that of the first absorption well layer 161, and the exit barrier layer 173 is formed as a thickest barrier layer in one period, and the layer thickness of the coupling barrier layer 172 is set to be smaller than that of the exit barrier layer 173. With this coupled quantum well structure in which the layer thicknesses of the respective semiconductor layers are thus set, in the absorption region 17, for the detection lower level $L_1$ arising from the ground level in the first absorption well layer 161, a level generated by coupling the first excitation level in the first absorption well layer 161 and the ground level in the second absorption well layer 162 can be used as a detection upper level $L_2$.

In this level structure, since the detection upper level $L_2$ is a coupled level between the first and second absorption well layers 161 and 162, electron transition by light absorption from the detection lower level $L_1$ to the detection upper level $L_2$ is not vertical transition inside the first absorption well layer 161 but diagonal transition being transition between levels whose centers of wave functions are spatially separated from each other. Accordingly, without lowering the transition intensity of light absorption, the carrier lifetime at the detection upper level $L_2$ can be lengthened, and relaxation of electrons excited to the detection upper level $L_2$ by light absorption to the detection lower level $L_1$ and generation of a reverse current caused by the relaxation can be suppressed.

In the above-described quantum cascade detector 1A, the energy interval between the detection lower level $L_1$ and the detection upper level $L_2$ to be used for light absorption is set to be larger than the energy $E_{LO}$ of longitudinal optical (LO) phonon. In this configuration, in the transport level structure for electrons consisting of the third level $L_3$ to the n-th level $L_n$ arising from the third well layer to the n-th well layer in the transport region 18, high-speed relaxation of electrons using LO phonon scattering can be used.

In this case, electrons excited to the detection upper level $L_2$ by light absorption move to the third level $L_3$ in the transport region 18 due to the resonant tunneling effect, and further, in the transport level structure configured by the third level $L_3$ to the n-th level $L_n$, electrons are transported at a high speed to the detection lower level $L_1$ of the unit laminate structure of the subsequent stage through an electron transport process including high-speed relaxation by LO phonon scattering. Accordingly, with the quantum cascade detector 1A constituted as described above, photodetection sensitivity to incident light can be improved. In addition, the subband level structure in the unit laminate structure 16 described above can be designed and controlled by the design of the quantum well structure in the unit laminate structure 16.

In the quantum cascade detector 1A according to the present embodiment, the energy interval between the detection lower level $L_1$ and the detection upper level $L_2$ to be used for light absorption is set to be larger than the energy of LO phonon as described above, so that the detector 1A serves as a photodetector that operates for light in the mid-infrared region as a detection target. Electrons excited to the detection upper level $L_2$ in response to light incidence tunnel the exit barrier layer 173 and flow in the forward direction, and are relaxed through an electron transport process including LO phonon scattering.

Here, in view of a quantum cascade detector that operates in the terahertz (THz) band, in such a detector, energy of light absorption is smaller than the energy of LO phonon, so that in the transport level structure for electrons after excitation by light absorption, there is no level to which the electrons can drop by emitting LO phonons, so that electron high-speed relaxation by LO phonon scattering cannot be used. In this case, electrons excited to the detection upper level by light absorption are relaxed at a low speed through a scattering process such as electron-electron scattering, alloy scattering, interface scattering, and acoustic phonon scattering, etc., which are comparatively slow in scattering time.

On the other hand, the quantum cascade detector 1A according to the embodiment described above is constituted so as to operate in the mid-infrared region by setting the energy interval between the detection lower level $L_1$ and the detection upper level $L_2$ to be larger than the energy of LO phonon, and in the transport level structure for electrons, high-speed relaxation using LO phonon scattering is used. With this configuration, the electron relaxation speed can be increased to be several orders of magnitude higher than that of the quantum cascade detector in the terahertz band.

Regarding the subband levels in the coupled quantum well structure including the first and second absorption well layers 161 and 162, as described above, it is preferable that, in the unit laminate structure 16, one level on the lower energy side of the two levels generated by coupling the excitation level in the first absorption well layer 161 and the ground level in the second absorption well layer 162 is the detection upper level $L_2$, and the energy interval between the other level $L_0$ on the higher energy side and the detection upper level $L_2$ is set to be larger than the energy $E_{LO}$ of LO phonon. By thus sufficiently separating the coupled level $L_0$ on the higher energy side from the detection upper level $L_2$ in terms of energy, contribution of the coupled level $L_0$ to light absorption can be sufficiently suppressed, and an intersubband light absorption process between the detection lower level $L_1$ and the detection upper level $L_2$ can be preferably realized.

Further, in the unit laminate structure 16, it is preferable that the energy interval between the third level $L_3$ and the fourth level $L_4$ is set to be $E_{LO}$ or more and $2 \times E_{LO}$ or less, with respect to the energy $E_{LO}$ of LO phonon. With this configuration, electrons that moved from the detection upper level $L_2$ to the third level $L_3$ due to the resonant tunneling effect are extracted at a high speed from the third level $L_3$ via LO phonon scattering. Accordingly, electrons excited to the detection upper level $L_2$ by light absorption can be further restrained from being relaxed to the detection lower level $L_1$ again without being transported to the unit laminate structure of the subsequent stage, and electrons excited by light absorption can be extracted as a forward current with high efficiency, and the efficiency of the photodetecting operation can be improved.

In the transport level structure for electrons, the energy interval between the fourth level $L_4$ and the fifth level $L_5$ may be set to be smaller than the energy $E_{LO}$ of LO phonon. Thus, with the configuration in which the fourth level $L_4$ and the fifth level $L_5$ are made close to each other, the plurality of levels including the fourth and fifth levels $L_4$ and $L_5$ can be made to function as levels to which electrons are extracted from the third level $L_3$ by LO phonon scattering. Accordingly, electron transport in the transport level structure can be stabilized and increased in speed.

As the coupling barrier layer 172 in the absorption region 17, a barrier layer significantly thinner than the exit barrier layer 173 is used as described above, in particular, preferably, a barrier layer thinnest in the unit laminate structure 16 of one period or a barrier layer having a layer thickness nearly equal to that of the thinnest barrier layer is used. In addition, preferably, the coupling barrier layer 172 has a layer thickness that is approximately ½, or ½ or less of the layer thickness of the exit barrier layer 173. Further, for example, when an $In_{0.53}Ga_{0.47}As/In_{0.52}Al_{0.48}As$ system lattice-matched with InP is used in the unit laminate structure 16, a layer thinner than 10 atomic layers (3.0 nm) is preferably used as the coupling barrier layer 172.

In the unit laminate structure 16, the first absorption well layer 161 to be used for light absorption is preferably formed of a semiconductor layer doped with an n-type impurity. Accordingly, photodetection by intersubband absorption between the detection lower level $L_1$ and the upper level $L_2$ in the absorption region 17 can be preferably realized. As the second absorption well layer 162, as in the case of the first absorption well layer 161, a semiconductor layer doped with an n-type impurity can be used. Alternatively, as the second absorption well layer 162, an undoped semiconductor layer may be used. Regarding well layers constituting a transport structure for electrons, in the unit laminate structure 16, the third well layer to the n-th well layer of the transport region 18 are preferably formed of undoped semiconductor layers, respectively.

Further, the above-described quantum cascade detector 1A may be constituted so that, between the second well layer 162 of the absorption region 17 and the third barrier layer 173 of the transport region 18, in addition to the respective layers from the first barrier layer 171 to the second well layer 162, m quantum barrier layers and m quantum well layers to be included in the absorption region 17 are further provided, provided that m is an integer of 1 or more. Thus, the absorption region 17 in the unit laminate structure 16 may have the coupled quantum well structure including three or more absorption well layers.

Figure 3:
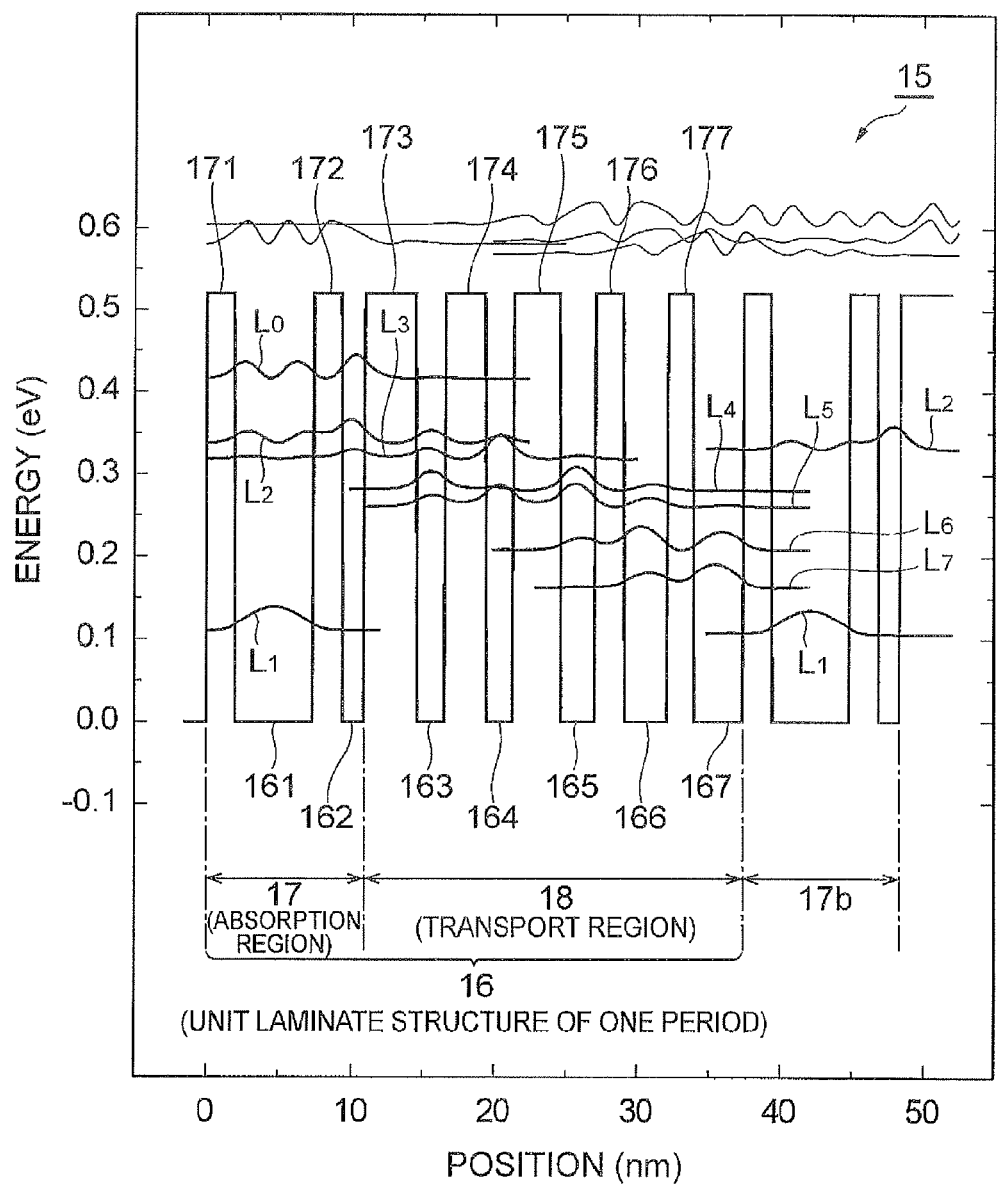
FIG. 3 is a diagram showing an example of a configuration of a unit laminate structure constituting the active layer.

The configuration of the quantum cascade detector according to the present invention will be described along with a specific example of a device structure including the quantum well structure in the active layer. Here, the entire layer structure in the quantum cascade detector uses the configuration shown in FIG. 1. FIG. 3 is a diagram showing an example of a configuration of a unit laminate structure constituting an active layer in the quantum cascade detector shown in FIG. 1.

The quantum well structure of the active layer 15 in this configuration example shows an example of design in which an absorption wavelength is set to 5.8 μm. FIG. 3 shows a quantum well structure and a subband level structure of a part of the multistage repeated structure of the unit laminate structures 16 each including the absorption region 17 and the transport region 18 in the active layer 15. The device structure shown in FIG. 1 and FIG. 3 can be formed by crystal growth using, for example, the molecular beam epitaxy (MBE) method or the metal organic vapor phase epitaxy (MOVPE) method.

In the semiconductor lamination structure of the quantum cascade detector 1A according to the present configuration example, as the semiconductor substrate 10 in the configuration shown in FIG. 1, an n-type InP single crystal substrate is used. On this InP substrate 10, in order from the substrate 10 side, an InGaAs lower contact layer 11 with a thickness of 600 nm, an active layer 15 formed by multistage-laminating the unit laminate structures 16, and an InGaAs upper contact layer 12 with a thickness of 200 nm are sequentially laminated to form the device structure of the quantum cascade detector 1A.

The active layer 15 in the present configuration example is formed by laminating 45 periods of the unit laminate structures 16 each including the absorption region 17 and the transport region 18. The unit laminate structure 16 of one period is constituted, as shown in FIG. 3, as a quantum well structure formed by alternately laminating seven quantum well layers 161 to 167 and seven quantum barrier layers 171 to 177.

Among these respective semiconductor layers of the unit laminate structure 16, the quantum well layers 161 to 167 are formed of InGaAs layers, respectively. The quantum barrier layers 171 to 177 are formed of InAlAs layers, respectively. Accordingly, the active layer 15 in the present configuration example consists of an InGaAs/InAlAs quantum well structure.

In this unit laminate structure 16, the first and second barrier layers 171 and 172 and the first and second well layers 161 and 162 constitute the absorption region 17 to be used for light absorption and detection. The third to seventh barrier layers 173 to 177 and the third to seventh well layers 163 to 167 constitute the transport region 18 to be used for transport and extraction of electrons. The first absorption well layer 161 to be used for light absorption is doped with Si being an n-type impurity for supply of electrons being carriers. The well layers 162 to 167 including the second absorption well layer 162 other than the first absorption well layer 161 are undoped layers. FIG. 4 shows an example of a specific structure of the unit laminate structure 16 of one period in the active layer 15.

In this configuration, the unit laminate structure 16 includes, in its subband level structure shown in FIG. 3, the detection lower level $L_1$, the detection upper level $L_2$, and the third level $L_3$ to the seventh level $L_7$ described above with reference to FIG. 2. The third to seventh levels $L_3$ to $L_7$ constitute a transport level structure that transports electrons excited to the upper level $L_2$ to the absorption region 17b of the subsequent stage.

When light is made incident on the active layer 15 having the unit laminate structures 16 described above, electrons present in the detection lower level $L_1$ are excited mainly to the detection upper level $L_2$ by intersubband absorption, and a part of electrons are excited to the third level $L_3$. At this time, the relaxation time in which the electrons are relaxed again from the levels $L_2$ and $L_3$ to the detection lower level $L_1$ is 3.0 ps, and this is about twice as long as the relaxation time of 1.5 ps in the case where a single quantum well structure is used in the absorption region in the same wavelength band. Accordingly, a current can be flowed in the forward direction at a high speed with high efficiency and the detector can be operated as a photodetector with high sensitivity. The respective layer thicknesses of the quantum well layers and the quantum barrier layers constituting the unit laminate structure 16 are designed based on quantum mechanics.

In design of the quantum well structure, by designing the first and second absorption well layers 161 and 162 in the absorption region 17, the states of the detection lower level $L_1$ and upper level $L_2$ and the energy interval between these are determined. At this time, as the second absorption well layer 162 is designed to be thick, the wave function of the detection upper level $L_2$ is localized on the well layer 162. In this case, the lifetime of carriers at the detection upper level $L_2$ which is determined according to LO phonons is lengthened, however, on the other hand, the dipole moment corresponding to the transition intensity of light absorption decreases. These are in a trade-off relationship, and it is considered that the most preferable conditions change according to the designed wavelength.

In the configuration example shown in FIG. 3, at the designed wavelength of 5.8 μm, the dipole moment is calculated to be $Z_{21}=2.0$ nm, and the scattering time due to LO phonon is calculated to be $\tau_{21}=3.0$ ps. On the other hand, in the configuration using a single quantum well structure in the absorption region in the same wavelength band, the dipole moment is calculated to be $Z_{21}=1.6$ nm, and the scattering time due to LO phonon is calculated to be $\tau_{21}=1.5$ ps, and the values of both parameters are more preferable in the configuration example using the coupled quantum well structure in the absorption region 17 shown in FIG. 3.

Figure 5:
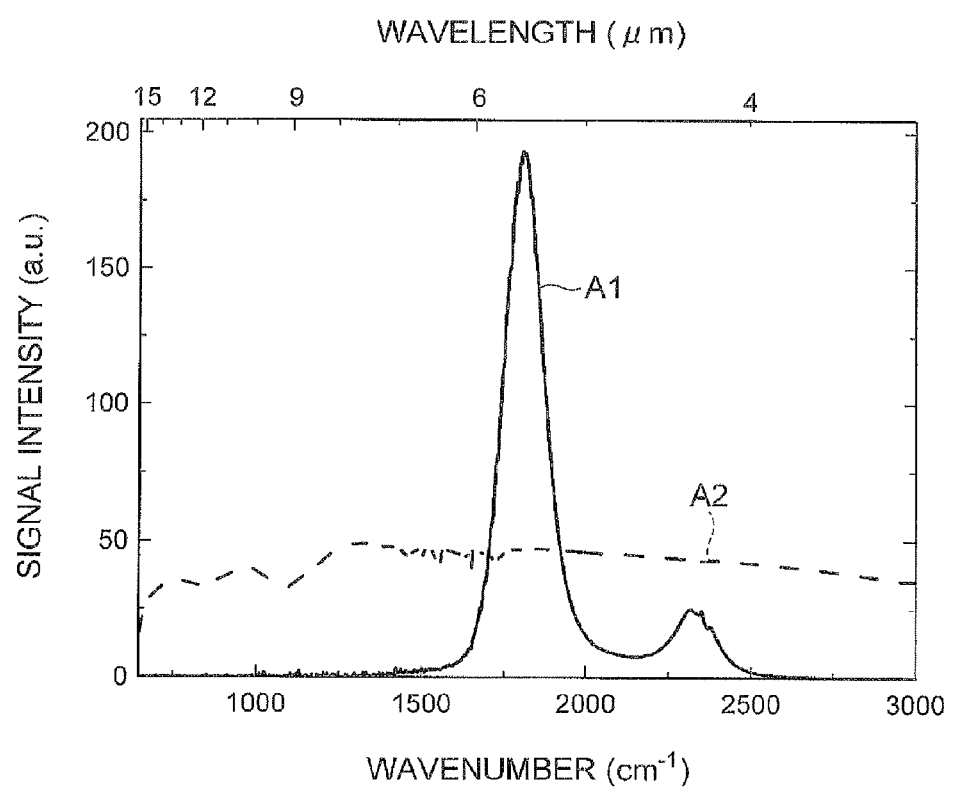
FIG. 5 is a graph showing a light absorption spectrum obtained with the quantum cascade detector.

FIG. 5 is a graph showing a light absorption spectrum obtained with the quantum cascade detector. In this graph, the horizontal axis shows the wavenumber (cm$^{-1}$) or wavelength (μm), and the vertical axis shows the signal intensity (a.u.) corresponding to absorption intensity. In FIG. 5, the graph A1 shows an absorption spectrum obtained with the quantum cascade detector constituted as described above, and the graph A2 shows an absorption spectrum obtained with a conventional MCT detector.

Here, both detection devices of the quantum cascade detector and the MCT detector were measured in the state where they were cooled to 77 K by using liquid nitrogen. As the quantum cascade detector, one formed by multistage-laminating 45 unit laminate structures 16 (1.69 μm in thickness of the active layer 15) was used. The device form of this quantum cascade detector is a ridge type, and the ridge width is 200 μm and the ridge length is 3 mm.

As shown in FIG. 5, when the quantum cascade detector constituted as described above was used, it showed a sensitivity significantly higher not only than the sensitivity of the quantum cascade detector having the conventional structure but also than the sensitivity of the MCT detector. The sensitivity of the detector of this configuration example is estimated to 3.7 A/W, and this sensitivity is three orders of magnitude higher than values (mA/W level) reported in papers, etc., at present. In addition, the quantum cascade detector constituted as described above is operable with zero bias, so that its noise level is also extremely low, and a calculated value of the specific detectivity D*(5.8 μm, 77 K, 2 kHz) is $1.76 \times 10^{11}$ (cmHz$^{1/2}$W$^{-1}$).

The configuration of the coupled quantum well structure consisting of the first absorption well layer 161, the coupling barrier layer 172, and the second absorption well layer 162 constituting the absorption region 17 in the above-described embodiment will be further described. In the coupled quantum well structure constituted as described above, the anticrossing gap between the excitation level in the first absorption well layer 161 and the ground level in the second absorption well layer 162 is preferably set to be larger than the energy $E_{LO}$ of longitudinal optical phonon. Accordingly, the levels such as the detection upper level $L_2$ to be generated by coupling the excitation level in the first absorption well layer 161 and the ground level in the second absorption well layer 162 can be preferably generated.

That is, in the above-described configuration, the level generated by coupling the excitation level in the first absorption well layer 161 and the ground level in the second absorption well layer 162 is used as the detection upper level $L_2$, so that these levels have to be strongly coupled. The magnitude of coupling between these two levels can be evaluated by the anticrossing energy gap between the levels. This anticrossing gap is defined by, specifically, a level interval formed when the two levels are at the same energy due to application of an electric field, etc. (refer to Patent Document 1).

Figure 6:
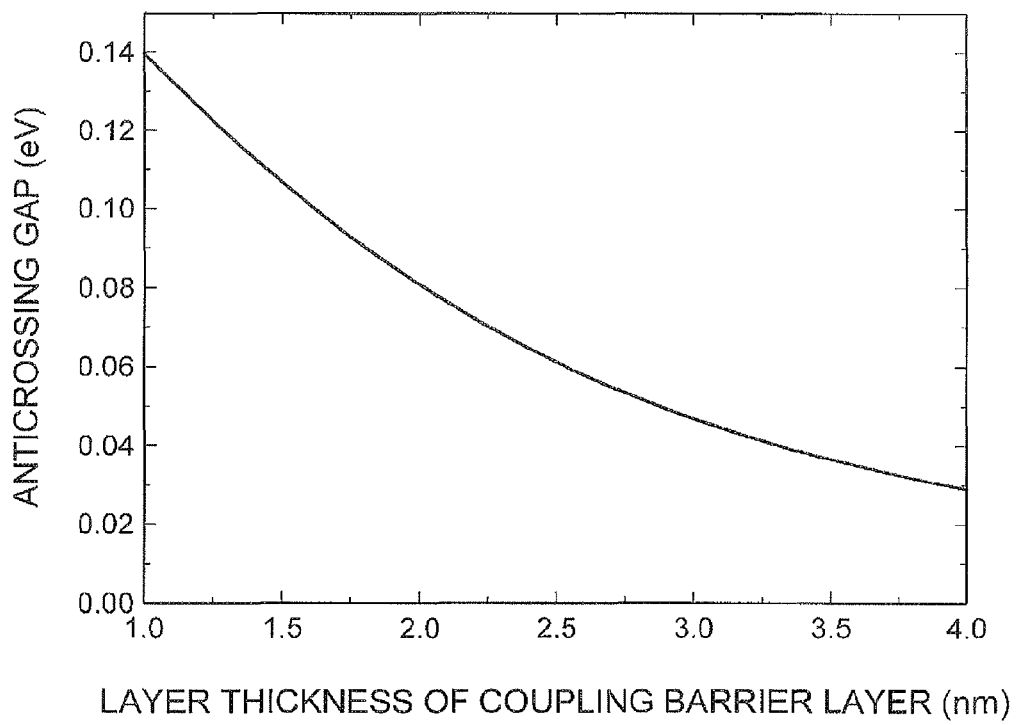
FIG. 6 is a graph showing dependency of an anticrossing gap between an excitation level in the first absorption well layer and a ground level in the second absorption well layer on the layer thickness of the coupling barrier layer.

FIG. 6 is a graph showing dependency of the anticrossing gap between the excitation level in the first absorption well layer and the ground level in the second absorption well layer on the layer thickness of the coupling barrier layer. In this graph, the horizontal axis shows the layer thickness (nm) of the coupling barrier layer 172, and the vertical axis shows the anticrossing gap (eV) between the excitation level in the first absorption well layer 161 and the ground level in the second absorption well layer 162.

As shown in this graph, the anticrossing gap showing the strength of coupling between the levels in the coupled quantum well structure changes according to the thickness of the coupling barrier layer 172 between the absorption well layers 161 and 162, and as the layer thickness of the coupling barrier layer 172 becomes thinner, the anticrossing gap becomes larger. Therefore, by the design of the layer thickness of the coupling barrier layer 172, the anticrossing gap in the above-described coupled quantum well structure can be properly set.

For example, in the configuration shown in FIG. 4, the layer thickness of the coupling barrier layer 172 is 2.0 nm, and from the graph of FIG. 6, it can be found that the anticrossing gap at this time is approximately 80 meV. Further, the layer thickness of the coupling barrier layer 172 is especially preferably set so that the anticrossing gap between the excitation level in the first absorption well layer 161 and the ground level in the second absorption well layer 162 becomes approximately $2 \times E_{LO}$. The energy interval between the coupled level $L_0$ on the higher energy side and the detection upper level $L_2$ is also set according to this anticrossing gap between the levels.

The quantum cascade detector according to the present invention is not limited to the above-described embodiment and configuration examples, and various modifications thereof are possible. For example, in the above-described configuration example, an InP substrate is used as the semiconductor substrate, and the active layer is made of InGaAs/InAlAs, however, specifically, various configurations can be used as long as light absorption and detection can be performed by intersubband transition in the quantum well structure and the above-described subband level structure can be realized.

As such a semiconductor material system, other than InGaAs/InAlAs described above, various material systems, for example, GaAs/AlGaAs, InAs/AlSb, GaN/AlGaN, and SiGe/Si, etc., can be used. As the semiconductor crystal growth method, various methods can also be used.

As the lamination structure in the active layer of the quantum cascade detector and the semiconductor lamination structure as the entire detector device, other than the structures shown in FIG. 1, FIG. 3, and FIG. 4, various structures can be used. Generally, any configuration of the quantum cascade detector may be adopted as long as the quantum cascade detector includes a semiconductor substrate and an active layer having the above-described configuration provided on the semiconductor substrate.

Regarding the numbers of barrier layers and well layers constituting the absorption region in the unit laminate structure, the above-described configuration example includes two barrier layers and well layers, however, as described above, three or more barrier layers and well layers may constitute the absorption region. The numbers of barrier layers and well layers constituting the transport region may also be set to arbitrary numbers. Further, in the above-described configuration example, a configuration lattice-matched with the InP substrate is described, however, for example, a configuration lattice-mismatched with the InP substrate can also be used. In this case, an increase in the degree of freedom of device design, efficient carrier confinement, and a shorter wavelength for the detector operation can be realized.

The quantum cascade detector according to the above-described embodiment includes (1) a semiconductor substrate, and (2) an active layer which is provided on the semiconductor substrate and has a cascade structure formed by multistage-laminating unit laminate structures each consisting of n (where n is an integer of 4 or more) quantum barrier layers and n quantum well layers, and (3) in the unit laminate structure, the n quantum barrier layers and the n quantum well layers are formed in the order of a first barrier layer, a first well layer, a second barrier layer, a second well layer, . . . , an n-th barrier layer, and an n-th well layer from the side of the unit laminate structure of the preceding stage, the first barrier layer to the second well layer constitute an absorption region, and the third barrier layer to the n-th well layer constitute a transport region, (4) in the absorption region, the first well layer functions as a first absorption well layer, the second well layer functions as a second absorption well layer, and the second barrier layer between these layers functions as a coupling barrier layer, and in the transport region, the third barrier layer functions as an exit barrier layer, (5) the first absorption well layer has the largest layer thickness among the n quantum well layers, the second absorption well layer has a layer thickness which is ½ or less of that of the first absorption well layer, the exit barrier layer has the largest layer thickness among the n quantum barrier layers, and the coupling barrier layer has a layer thickness which is smaller than that of the exit barrier layer, (6) the unit laminate structure has, in its subband level structure, a detection lower level arising from a ground level in the first absorption well layer, a detection upper level generated by coupling an excitation level in the first absorption well layer and a ground level in the second absorption well layer, and a third level to an n-th level arising from the third well layer to the n-th well layer, and the energy interval between the detection lower level and the detection upper level is set to be larger than the energy $E_{LO}$ of longitudinal optical phonons, and (7) light is detected by intersubband absorption from the detection lower level to the detection upper level in the absorption region, and electrons excited by the intersubband absorption move to the third level due to the resonant tunneling effect, and are transported to the detection lower level in the unit laminate structure of the subsequent stage via a transport level structure consisting of the third level to the n-th level in the transport region.

In the above-described quantum cascade detector, the energy interval between the detection lower level and the detection upper level to be used for light absorption is set to be larger than the energy of LO phonon as described above, so that the quantum cascade detector becomes a photodetector that operates in the mid-infrared region. The subband level structure in the unit laminate structure described above can be designed and controlled by the design of the quantum well structure in the unit laminate structure.

Here, regarding subband levels in the coupled quantum well structure, preferably, in the unit laminate structure, one level on the lower energy side of two levels generated by coupling the excitation level in the first absorption well layer and the ground level in the second absorption well layer is the detection upper level, and the energy interval between the other level on the higher energy side and the detection upper level is set to be larger than the energy $E_{LO}$ of longitudinal optical phonon. Accordingly, contribution of the coupled level on the higher energy side to light absorption can be suppressed, and an intersubband light absorption process between the detection lower level and the detection upper level (coupled level on the lower energy side) can be preferably realized.

In the unit laminate structure, the anticrossing gap between the excitation level in the first absorption well layer and the ground level in the second absorption well layer is preferably set to be larger than the energy $E_{LO}$ of longitudinal optical phonon. Accordingly, a level such as the detection upper level to be generated by coupling the excitation level in the first absorption well layer and the ground level in the second absorption well layer can be preferably generated.

In the unit laminate structure, the energy interval between the third level and the fourth level is preferably set to $E_{LO}$ or more and $2 \times E_{LO}$ or less, with respect to the energy $E_{LO}$ of longitudinal optical phonon. With this configuration, electrons that moved from the detection upper level to the third level due to the resonant tunneling effect are extracted at a high speed from the third level via LO phonon scattering. Accordingly, electrons excited to the detection upper level by light absorption can be further restrained from being relaxed again to the detection lower level.

In the unit laminate structure, the first absorption well layer is preferably formed of a semiconductor layer doped with an n-type impurity. Accordingly, photodetection by intersubband absorption between the detection lower level and the upper level in the absorption region can be preferably realized. Regarding the well layers constituting the transport structure for electrons, in the unit laminate structure, the third well layer to the n-th well layer are preferably formed of undoped semiconductor layers, respectively.

The quantum cascade detector described above may be constituted so that, between the second well layer in the absorption region and the third barrier layer in the transport region, in addition to the respective layers from the first barrier layer to the second well layer, m (where m is an integer of 1 or more) quantum barrier layers and m quantum well layers to be included in the absorption region are further provided. Thus, the absorption region in the unit laminate structure may also include three or more absorption well layers.

The present invention is applicable as a quantum cascade detector with improved photodetection sensitivity to incident light.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:
1. A quantum cascade detector comprising:
   a semiconductor substrate; and an active layer being provided on the semiconductor substrate, and having a cascade structure formed by multi-stage-laminating unit laminate structures each consisting of n (where n is an integer of 4 or more) quantum barrier layers and n quantum well layers, wherein in the unit laminate structure, the n quantum barrier layers and the n quantum well layers are formed in the order of a first barrier layer, a first well layer, a second barrier layer, a second well layer, . . . , an n-th barrier layer, and an n-th well layer from the side of the unit laminate structure of the preceding stage, the first barrier layer to the second well layer constitute an absorption region, and the third barrier layer to the n-th well layer constitute a transport region, in the absorption region, the first well layer functions as a first absorption well layer, the second well layer functions as a second absorption well layer, and the second barrier layer between these layers functions as a coupling barrier layer, and in the transport region, the third barrier layer functions as an exit barrier layer, the first absorption well layer has the largest layer thickness among the n quantum well layers, the second absorption well layer has a layer thickness ½ or less of that of the first absorption well layer, the exit barrier layer has the largest layer thickness among the n quantum barrier layers, and the coupling barrier layer has a layer thickness smaller than that of the exit barrier layer, the unit laminate structure has, in its subband level structure, a detection lower level arising from a ground level in the first absorption well layer, a detection upper level generated by coupling an excitation level in the first absorption well layer and a ground level in the second absorption well layer, and a third level to an n-th level arising from the third well layer to the n-th well layer, and an energy interval between the detection lower level and the detection upper level is set to be larger than the energy $E_{LO}$ of longitudinal optical phonon, and light is detected by intersubband absorption from the detection lower level to the detection upper level in the absorption region, and electrons excited by the intersubband absorption move to the third level due to the resonant tunneling effect, and are transported to the detection lower level in the unit laminate structure of the subsequent stage via a transport level structure consisting of the third level to the n-th level in the transport region, and wherein in the unit laminate structure, one level on the lower energy side of two levels generated by coupling the excitation level in the first absorption well layer and the ground level in the second absorption well layer is the detection upper level, and an energy interval between the other level on the higher energy side and the detection upper level is set to be larger than the energy $E_{LO}$ of longitudinal optical phonon.

2. The quantum cascade detector according to claim 1, wherein, in the unit laminate structure, the anticrossing gap between the excitation level in the first absorption well layer and the ground level in the second absorption well layer is set to be larger than the energy $E_{LO}$ of longitudinal optical phonon.

3. The quantum cascade detector according to claim 1, wherein, in the unit laminate structure, an energy interval between the third level and the fourth level is set to $E_{LO}$ or more and $2 \times E_{LO}$ or less, with respect to the energy $E_{LO}$ of longitudinal optical phonon.

4. The quantum cascade detector according to claim 1, wherein, in the unit laminate structure, the first absorption well layer is formed of a semiconductor layer doped with an n-type impurity.

5. The quantum cascade detector according to claim 1, wherein, in the unit laminate structure, the third well layer to the n-th well layer are formed of undoped semiconductor layers, respectively.

6. The quantum cascade detector according to claim 1, wherein, between the second well layer of the absorption region and the third barrier layer of the transport region, in addition to the respective layers from the first barrier layer to the second well layer, m (where m is an integer of 1 or more) quantum barrier layers and m quantum well layers to be included in the absorption region are provided.

* * * * *

UNITED STATES PATENT AND TRADEMARK OFFICE
CERTIFICATE OF CORRECTION

PATENT NO. : 9,276,144 B2
APPLICATION NO. : 14/525415
DATED : March 1, 2016
INVENTOR(S) : Kazuue Fujita et al.

Page 1 of 1

It is certified that error appears in the above-identified patent and that said Letters Patent is hereby corrected as shown below:

In Item (72) "Inventors" on the title page of the above-identified patent, change "Hamamtsu" to --Hamamatsu--

Signed and Sealed this
Twenty-third Day of August, 2016

Michelle K. Lee
*Director of the United States Patent and Trademark Office*